(12) United States Patent
Yamazaki

(10) Patent No.: US 11,639,946 B2
(45) Date of Patent: May 2, 2023

(54) SENSOR AND ELECTRIC DEVICE

(71) Applicant: KABUSHIKI KAISHA TOSHIBA, Tokyo (JP)

(72) Inventor: Hiroaki Yamazaki, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/668,230

(22) Filed: Feb. 9, 2022

(65) Prior Publication Data
US 2023/0078060 A1   Mar. 16, 2023

(30) Foreign Application Priority Data

Sep. 15, 2021   (JP) .............................. JP2021-149811

(51) Int. Cl.
*G01R 1/20* (2006.01)
*G01R 19/00* (2006.01)

(52) U.S. Cl.
CPC .......... *G01R 1/203* (2013.01); *G01R 19/0092* (2013.01)

(58) Field of Classification Search
CPC .. G01R 1/203; G01R 19/0092; G01R 15/146; G01R 19/0007
USPC ........................................................ 324/126
See application file for complete search history.

(56) References Cited

U.S. PATENT DOCUMENTS

| | | | |
|---|---|---|---|
| 2013/0312517 A1* | 11/2013 | Jeong ................. | G01C 19/5719 73/504.04 |
| 2015/0226768 A1* | 8/2015 | Nakamura ............ | G01R 1/203 324/126 |
| 2016/0084888 A1* | 3/2016 | Busemann ............ | G01R 15/16 324/126 |
| 2017/0197820 A1* | 7/2017 | Naruse ................. | B81B 7/0074 |
| 2017/0292970 A1* | 10/2017 | Isobe .................... | G01P 15/125 |

FOREIGN PATENT DOCUMENTS

JP   2020-180895 A   11/2020

* cited by examiner

*Primary Examiner* — Tung X Nguyen
*Assistant Examiner* — Robert P Alejnikov, Jr.
(74) *Attorney, Agent, or Firm* — Finnegan, Henderson, Farabow, Garrett & Dunner, LLP

(57) ABSTRACT

According to one embodiment, a sensor includes a base including a first face including a first face region, and a first structure body fixed to the first face region. The first structure body includes a first support portion fixed to the first face region, a second support portion fixed to the first face region, a first movable portion, and a first fixed electrode fixed to the first face region. The first movable portion is supported by the first and second support portions and apart from the base in a first direction crossing the first face region. The first movable portion includes a first movable electrode facing the first fixed electrode, and a first conductive member. A first current flows the first conductive member along a second direction crossing the first direction. A first gap is provided between the first fixed electrode and the first movable portion.

19 Claims, 9 Drawing Sheets

US 11,639,946 B2

SENSOR AND ELECTRIC DEVICE

CROSS-REFERENCE TO RELATED APPLICATIONS

This application is based upon and claims the benefit of priority from Japanese Patent Application No. 2021-149811, filed on Sep. 15, 2021; the entire contents of which are incorporated herein by reference.

FIELD

Embodiments described herein relate generally to a sensor and an electric device.

BACKGROUND

For example, there is a sensor that detects an electric current. Practical sensors and electric devices are desired.

DETAILED DESCRIPTION

Figure 1A:
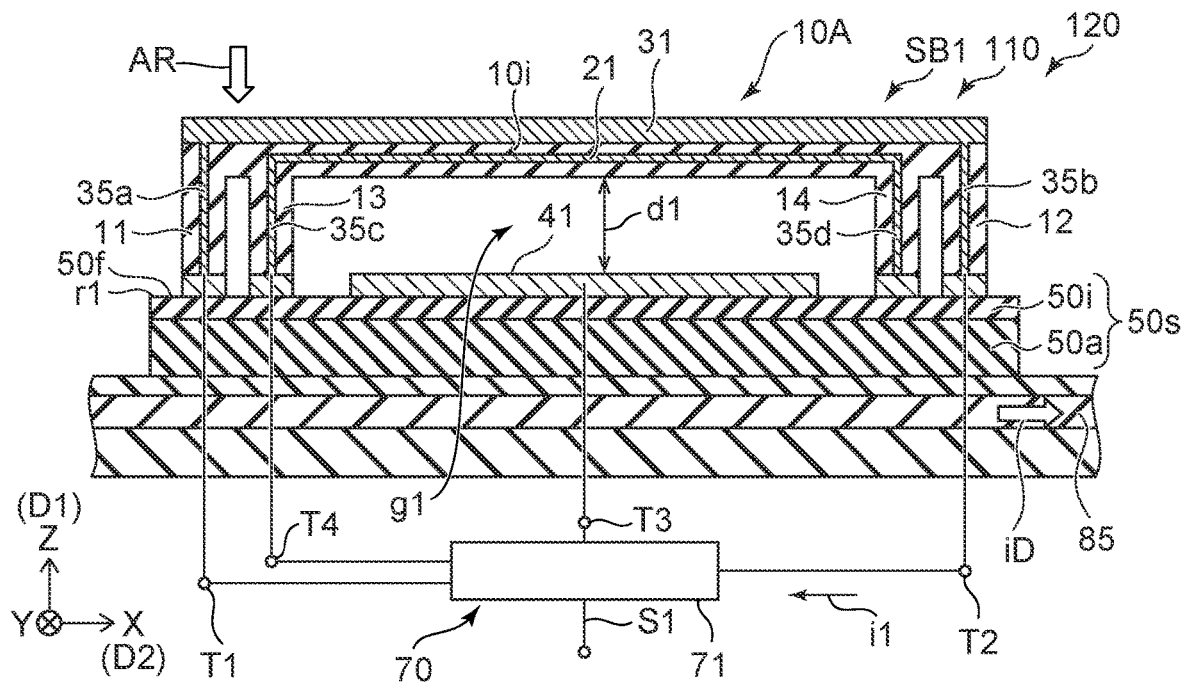
FIGS. 1A and 1B are schematic views illustrating a sensor according to a first embodiment.

According to one embodiment, a sensor includes a base including a first face including a first face region, and a first structure body fixed to the first face region. The first structure body includes a first support portion fixed to the first face region, a second support portion fixed to the first face region, a first movable portion, and a first fixed electrode fixed to the first face region. The first movable portion is supported by the first support portion and the second support portion and apart from the base in a first direction crossing the first face region. The first movable portion includes a first movable electrode facing the first fixed electrode, and a first conductive member. A first current is configured to flow the first conductive member along a second direction crossing the first direction. A first gap is provided between the first fixed electrode and the first movable portion.

According to one embodiment, an electric device includes the sensor described above, and an electric circuit, A detection target current is configured to flow through the electric circuit. The detection target current is configured to flow along the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
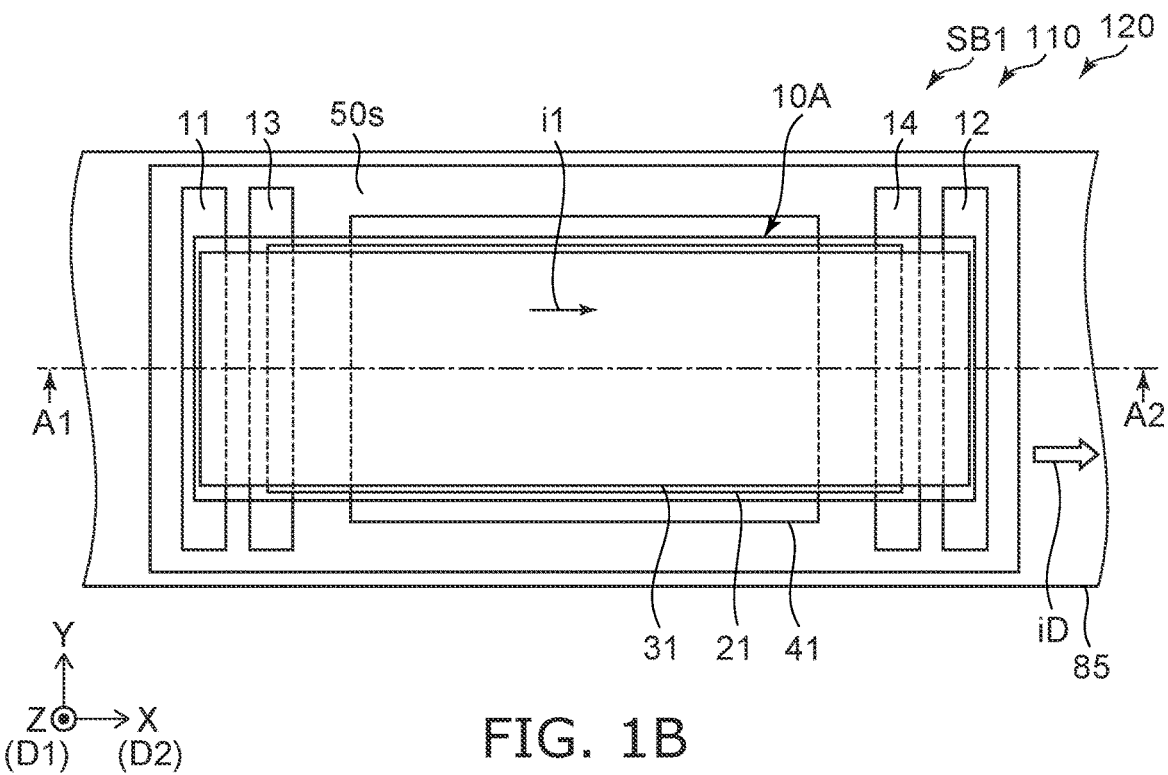

FIGS. 1A and 1B are schematic views illustrating a sensor according to the a first embodiment, FIG. 1A is a cross-sectional view taken along the line A1-A2 of FIG. 1B, FIG. 1B is a transparent plan view seen along the arrow AR of FIG. 1A.

As shown in FIGS. 1A and 1B, a sensor 110 according to the embodiment includes a base 50s and a first structure body SB1. An electric device 120 according to the embodiment includes the sensor 110 and a detection target wiring 85.

The base 50s includes a first face 50f. In this example, the base 50s includes a base member 50a and a base insulating layer 50i. A base insulating layer 50i is provided on the base member 50a. The first face 50f is, for example, an upper face of the base insulating layer 50i.

A direction perpendicular to the first face 50f is a Z-axis direction, One direction perpendicular to the Z-axis direction is defined as an X-axis direction. The direction perpendicular to the Z-axis direction and the X-axis direction is defined as a Y-axis direction.

The base 50s includes a first face region r1. The first face region r1 is a part region of the first face 50f.

The first structure body SB1 is fixed to one region (the first face region r1) of the first face 50f. The first structure body SB1 includes a first support portion 11, a second support portion 12, a first movable portion 10A, and a first fixed electrode 41.

The first support portion 11 and the second support portion 12 are fixed to the first face region r1. The first movable portion 10A is supported by the first support portion 11 and the second support portion 12. The first movable portion 10A is apart from the base 50S in the first direction D1 crossing the first face region r1. The first fixed electrode 41 is fixed to the first face region r1.

The first movable portion 10A includes a first movable electrode 21 and a first conductive member 31. At least a part of an insulating member 10i is provided between the first movable electrode 21 and the first conductive member 31, The first movable electrode 21 faces the first fixed electrode 41. A first gap g1 is provided between the first fixed electrode 41 and the first movable portion 10A.

As shown in FIG. 1B, a first current i1 can flow through the first conductive member 31. The first current i1 is along a second direction D2, The second direction D2 crosses the first direction D1. The second direction D2 is, for example, the X-axis direction.

For example, a direction from the first support portion 11 to the second support portion 12 is along the second direction D2.

As shown in FIGS. 1A and 1B, the detection target wiring 85 is provided. The detection target current iD flows through the detection target wiring 85. The detection target current iD has a component in the second direction D2. A magnetic field is generated by the detection target current iD.

Lorentz force is generated in the first movable portion 10A by the first current i1 flowing through the first conductive member 31 and the magnetic field generated by the detection target current iD. A direction of the Lorentz force has a component of the first direction D1. As a result, the first movable portion 10A is displaced along the first direction D1. The magnitude of the Lorentz force changes according to the magnitude of the detection target current iD. The direction of the Lorentz force changes according to the direction (polarity) of the current iD to be detected.

The generated Lorentz force changes the distance between the first fixed electrode 41 and the first movable electrode 21, For example, a first distance d1 between the first fixed electrode 41 and the first movable portion 10A changes. With the change of the first distance d1, a capacitance (a first capacitance) between the first fixed electrode 41 and the first movable electrode 21 changes. That is, the first capacitance between the first fixed electrode 41 and the first movable electrode 21 changes according to the detection target current iD. By detecting the change in the first capacitance, the detection target current iD can be detected.

According to the embodiment, the detection target current iD can be detected with a simple configuration. The detection target current iD may be a DC current or an AC current.

For example, there is a reference example of detecting an electric current using a magnetic resistor. In this reference example, the manufacturing process of the detection element including the magnetic resistor is complicated. In the embodiment, no complicated manufacturing process is required. In the embodiment, the current can be detected by a simple configuration. A practical sensor can be provided.

As described above, in the embodiment, when the first current i1 along the second direction D2 (X-axis direction) flows through the first conductive member 31, the first distance d1 between the first fixed electrode 41 and the first movable portion 10A changes according to the detection target current iD along the second direction D2, When the first current i1 along the second direction D2 flows through the first conductive member 31, the capacitance between the first fixed electrode 41 and the first movable electrode 21 changes are according to the detection target current iD along the second direction D2.

As shown in FIG. 1B, the first structure body SB1 may include first to fourth terminals T1 to T4. The first terminal T1 is electrically connected with one end of the first conductive member 31. The second terminal T2 is electrically connected with the other end of the first conductive member 31, The third terminal T3 is electrically connected with the first fixed electrode 41. The fourth terminal T4 is electrically connected with the first movable electrode 21.

The controller 70 can supply the first current i1 to the first conductive member 31 via, for example, the first terminal T1 and the second terminal T2. The controller 70 can detect a change in the first capacitance between the first fixed electrode 41 and the first movable electrode 21 via the third terminal T3 and the fourth terminal T4, A first circuit 71 of the controller 70 can output a signal S1 corresponding to the change in the first capacitance.

As shown in FIG. 1B, for example, the first fixed electrode 41 is located between the detection target wiring 85 through which the detection target current ifs flows and the first movable portion 10A, As a result, an appropriate capacitance is likely to be formed between the first fixed electrode 41 and the first movable electrode 21.

As shown in FIG. 1B, in this example, in the first direction D1, the first movable electrode 21 is located between the first fixed electrode 41 and the first conductive member 31. As a result, an appropriate capacitance is likely to be formed between the first fixed electrode 41 and the first movable electrode 21.

As shown in FIG. 1A, the first structure body SB1 may include a first connecting conductive portion 35a and a second connecting conductive portion 35b. The first connecting conductive portion 35a is electrically connected with one end of the first conductive member 31, The second connecting conductive portion 35b is electrically connected with the other end of the first conductive member 31, For example, at least a part of the first connecting conductive portion 35a passes through the first support portion 11. At least a part of the second connecting conductive portion 35b passes through the second support portion 12. For example, the first connection conductive portion 35a is electrically connected with the first terminal T1. For example, the second connecting conductive portion 35b is electrically connected with the second terminal T2.

As shown in FIG. 1A, the first structure body SB1 may include a third connecting conductive portion 35c and a fourth connecting conductive portion 35d. The third connection conductive portion 35c is electrically connected with a part of the first movable electrode 21. The fourth connecting conductive portion 35d is electrically connected with the other part of the first movable electrode 21. At least one of the third connecting conductive portion 35c and the fourth connecting conductive portion 35d is electrically connected with the fourth terminal T4.

As shown in FIGS. 1A and 1B, in this example, the first structure body SB1 includes a third support portion 13 and a fourth support portion 14, The third support portion 13 supports at least a part of the first movable portion 10A. The fourth support portion 14 supports at least a part of the first movable portion 10A. At least a part of the third connection conductive portion 35c may pass through the third support portion 13. At least a part of the fourth connecting conductive portion 35d may pass through the fourth support portion 14.

The third support portion 13 may be continuous with the first support portion 11. The boundary between the third support portion 13 and the first support portion 11 may be clear or unclear. The third support portion 13 may be omitted. The fourth support portion 14 may be continuous with the second support portion 12. The boundary between the fourth support portion 14 and the second support portion 12 may be clear or unclear. The fourth support portion 14 may be omitted.

In this example, a direction from the first support portion 11 to the second support portion 12 is along the second direction D2. In this example, a direction from the third support portion 13 to the fourth support portion 14 is along the second direction D2.

Figure 2:
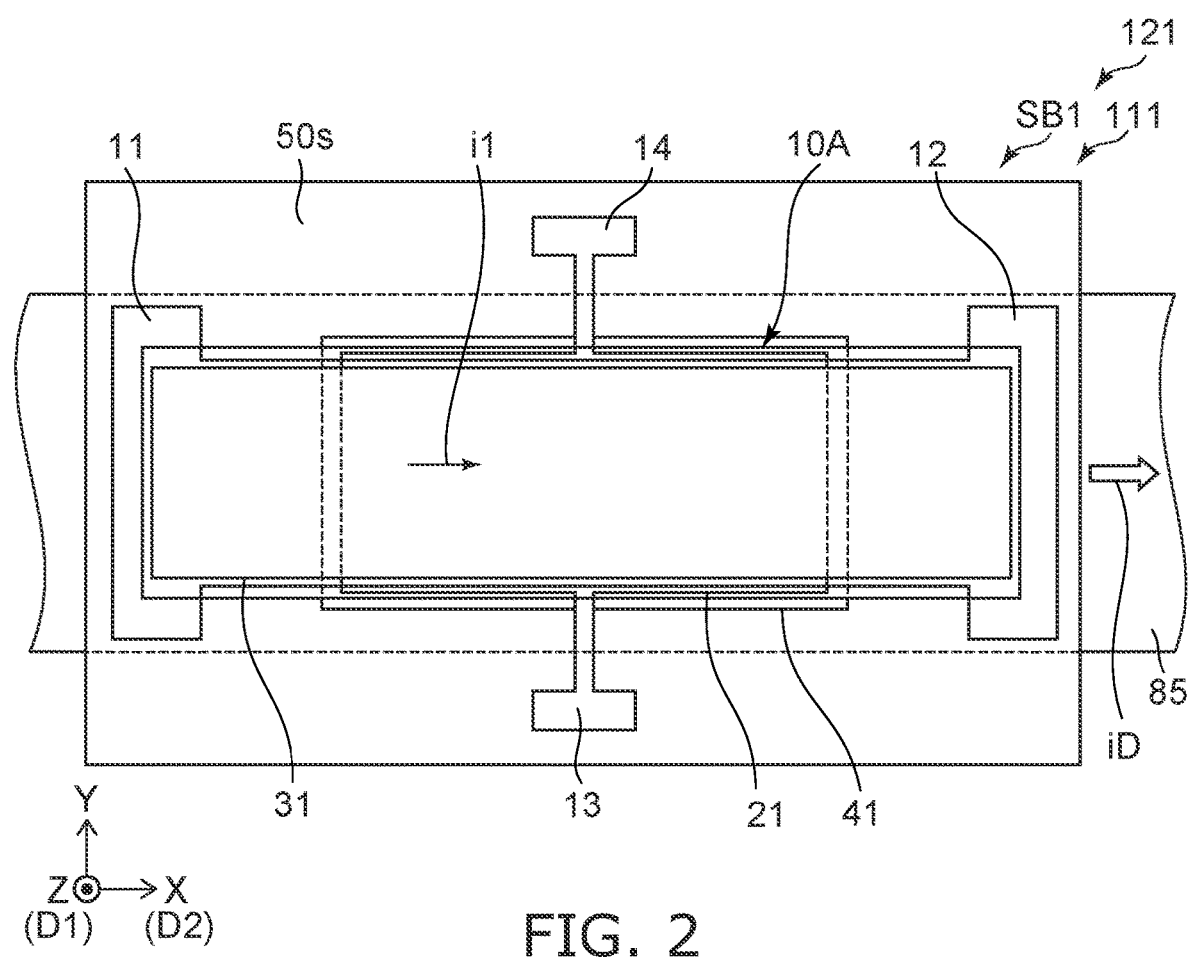
FIG. 2 is a schematic plan view illustrating a sensor according to the first embodiment.

FIG. 2 is a schematic plan view illustrating a sensor according to the first embodiment.

As shown in FIG. 2, in a sensor 111 (and an electric device 121) according to the embodiment, the positions of the third support portion 13 and the fourth support portion 14 are different from those in the sensor 110, Except for this, the configuration of the sensor 111 may be the same as that of the sensor 110.

In the sensor 111, the direction from the third support portion 13 to the fourth support portion 14 crosses the plane including the first direction D1 and the second direction D2. The direction from the third support portion 13 to the fourth support portion 14 is, for example, along the Y-axis direction. Also in the sensor 111, the current can be detected by a simple configuration. A practical sensor can be provided.

Figure 3:
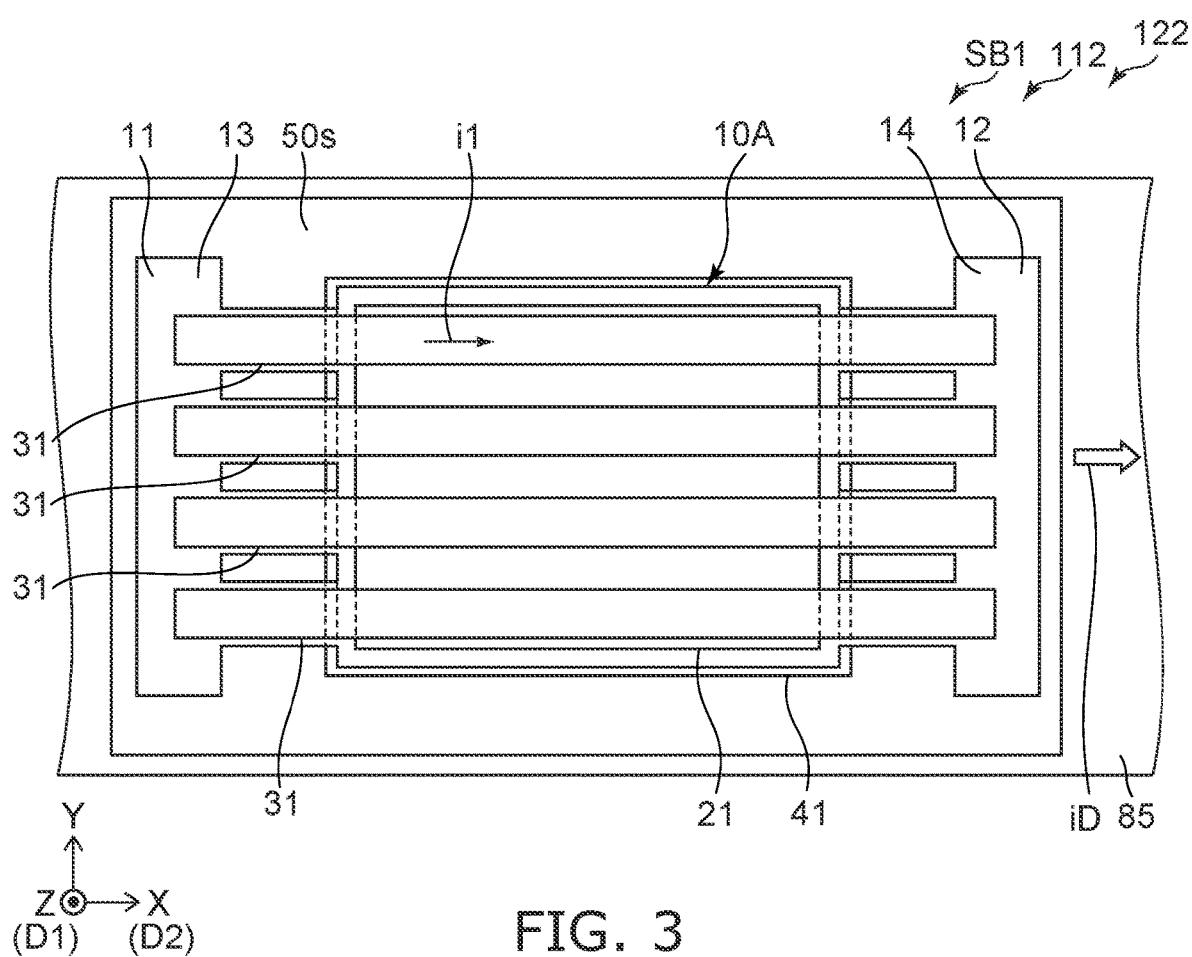
FIG. 3 is a schematic plan view illustrating a sensor according to the first embodiment.

FIG. 3 is a schematic plan view illustrating a sensor according to the first embodiment.

As shown in FIG. 3, in a sensor 112 (and an electric device 122) according to the embodiment, the first movable portion 10A includes a plurality of first conductive members 31. Except for this, the configuration of the sensor 112 may be the same as that of the sensor 110. Also in the sensor 112, the current can be detected with a simple configuration. A practical sensor can be provided.

Figure 4:
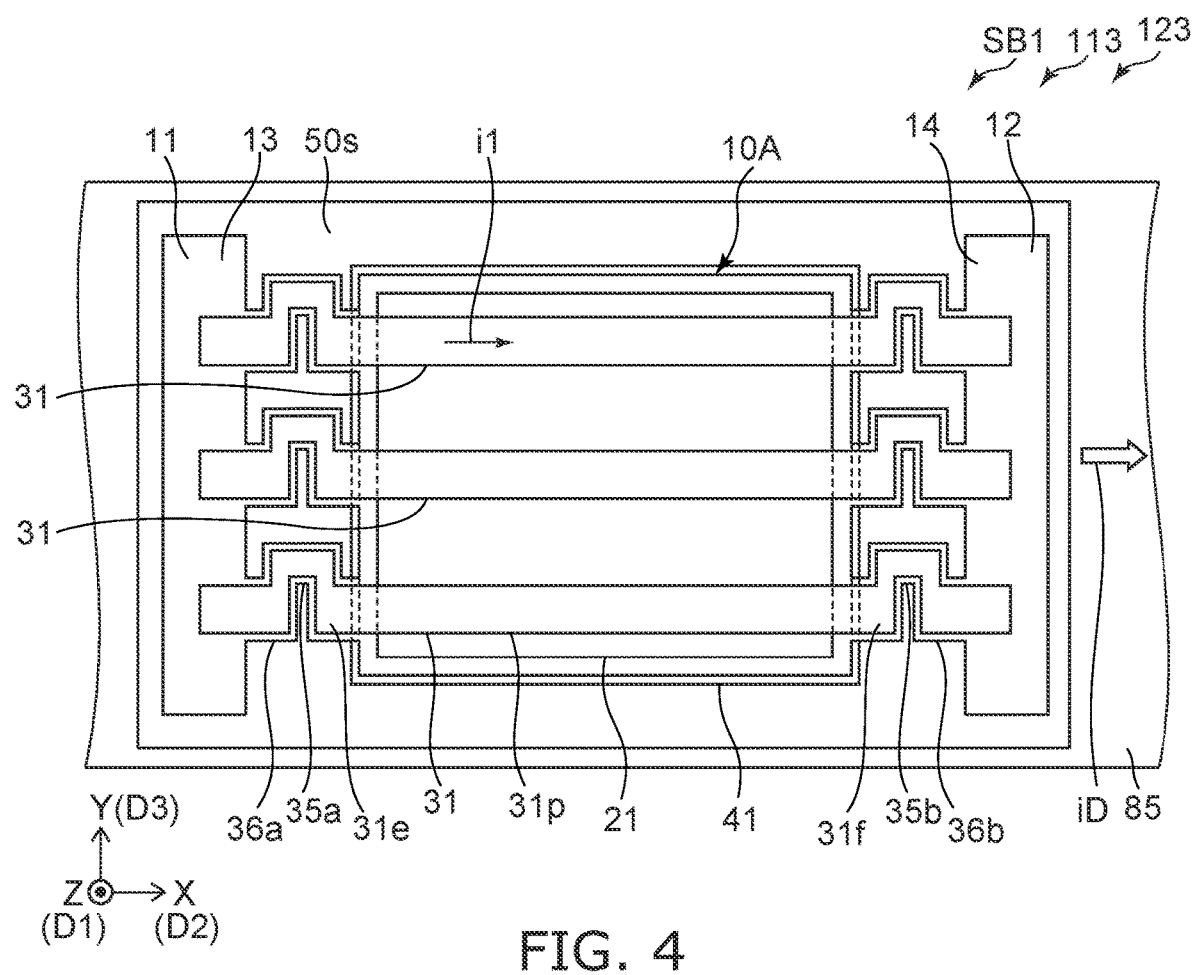
FIG. 4 is a schematic plan view illustrating a sensor according to the first embodiment.

FIG. 4 is a schematic plan view illustrating a sensor according to the first embodiment.

As shown in FIG. 4, in a sensor 113 (and an electric device 123) according to the embodiment, the shape of the first structure body SB1 (or the first conductive member 31) is different from that in the sensor 112. Except for this, the configuration of the sensor 113 may be the same as that of the sensor 110 or the sensor 112.

In the sensor 113, the first structure body SB1 includes a first flexible portion 36a and a second flexible portion 36b. The first flexible portion 36a is provided between the first support portion 11 and the first movable electrode 21. The first flexible portion 36a connects the first support portion 11 and the first movable electrode 21. The second flexible portion 36b is provided between the second support portion 12 and the first movable electrode 21. The second flexible portion 36b connects the second support portion 12 and the first movable electrode 21. In one example, a stiffness of the first flexible portion 36a is lower than a stiffness of the first movable electrode 21, In one example, the stiffness of the second flexible portion 36b is lower than the rigidity of the first movable electrode 21. For example, the first flexible portion 36a and the second flexible portion 36b have a meander structure (bent structure). By providing the first flexible portion 36a and the second flexible portion 36b, the first movable portion 10A is easily displaced. For example, the width of each of the first flexible portion 36a and the second flexible portion 36b in a third direction D3 is smaller than the width of the first movable electrode 21 in the third direction D3. The third direction D3 crosses a plane including the first direction D1 and the second direction D2. The third direction D3 is, for example, the Y-axis direction.

In the sensor 113, the first structure body SB1 includes a first connecting conductive portion 35a and a second connecting conductive portion 35b. The first connecting conductive portion 35a is electrically connected with one end 31e of the first conductive member 31. The second connecting conductive portion 35b is electrically connected with the other end 31f of the first conductive member 31.

At least a part of the first connecting conductive portion 35a passes through the first flexible portion 36a. At least a part of the second connecting conductive portion 35b passes through the second flexible portion 36b.

The first conductive member 31, the first connecting conductive portion 35a, the second connecting conductive portion 35b, the first flexible portion 36a, and the second flexible portion 36b are included in one extending member. A plurality of extending members may be provided.

In the examples of the sensors 110 to 113, in the Z-axis direction, substantially the entire first movable portion 10A overlaps the detection target wiring 85 through which the detection target current iD flows.

Figure 5:
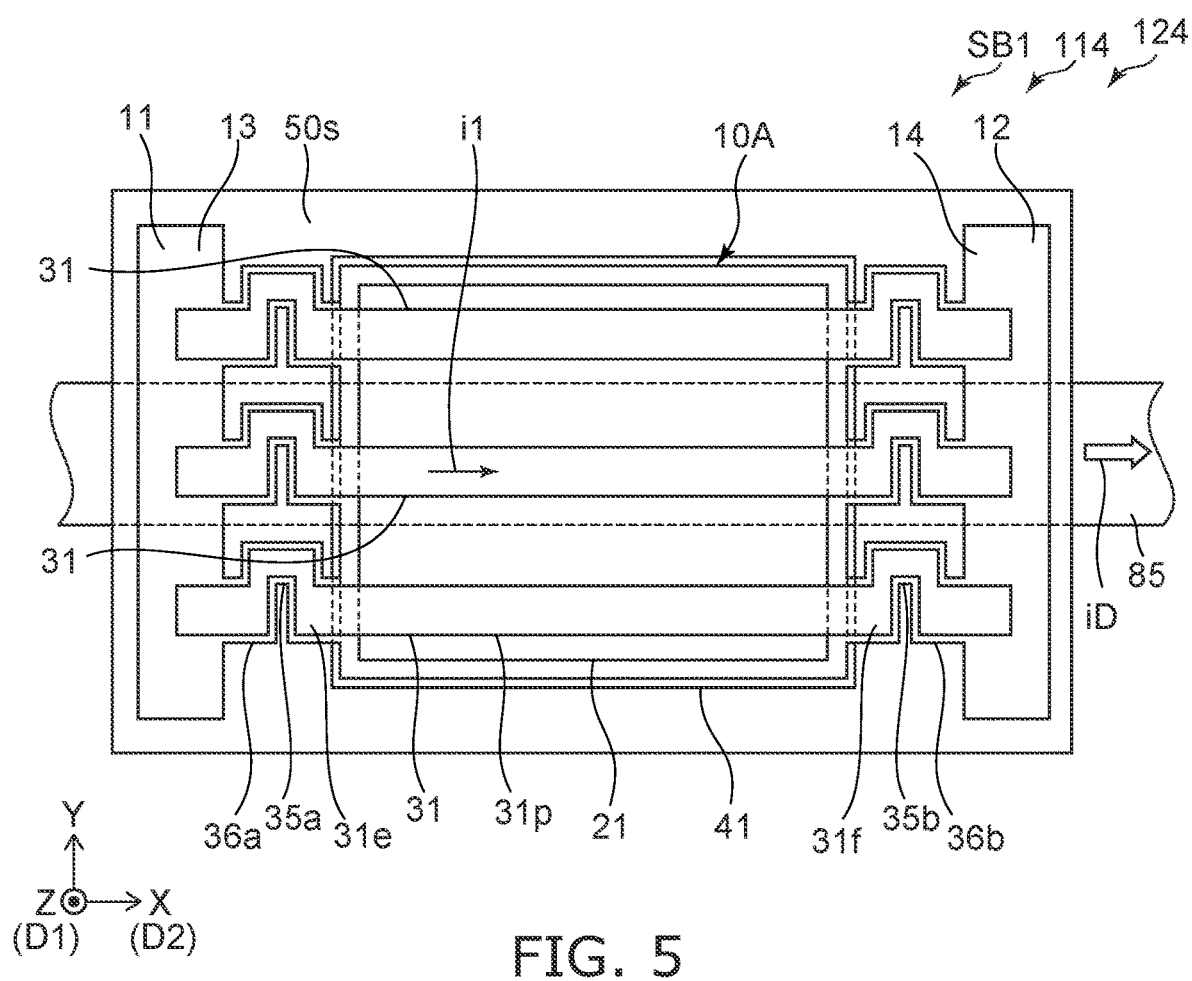
FIG. 5 is a schematic plan view illustrating a sensor according to the first embodiment.

FIG. 5 is a schematic plan view illustrating a sensor according to the first embodiment.

As shown in FIG. 5, in a sensor 114 (and an electric device 124) according to the embodiment, in the Z-axis direction, a part of the first movable portion 10A overlaps the detection target wiring 85 through which the detection target current iD flows, Except for this, the configuration of the sensor 114 may be the same as that of the sensor 113. Even if a part of the first movable portion 10A does not overlap the detection target wiring 85, the first distance d1 between the first fixed electrode 41 and the first movable portion 10A changes according to the detection target current iD. The first capacitance changes, FIG. 6 is a schematic plan view illustrating a sensor according to the first embodiment.

Figure 6:
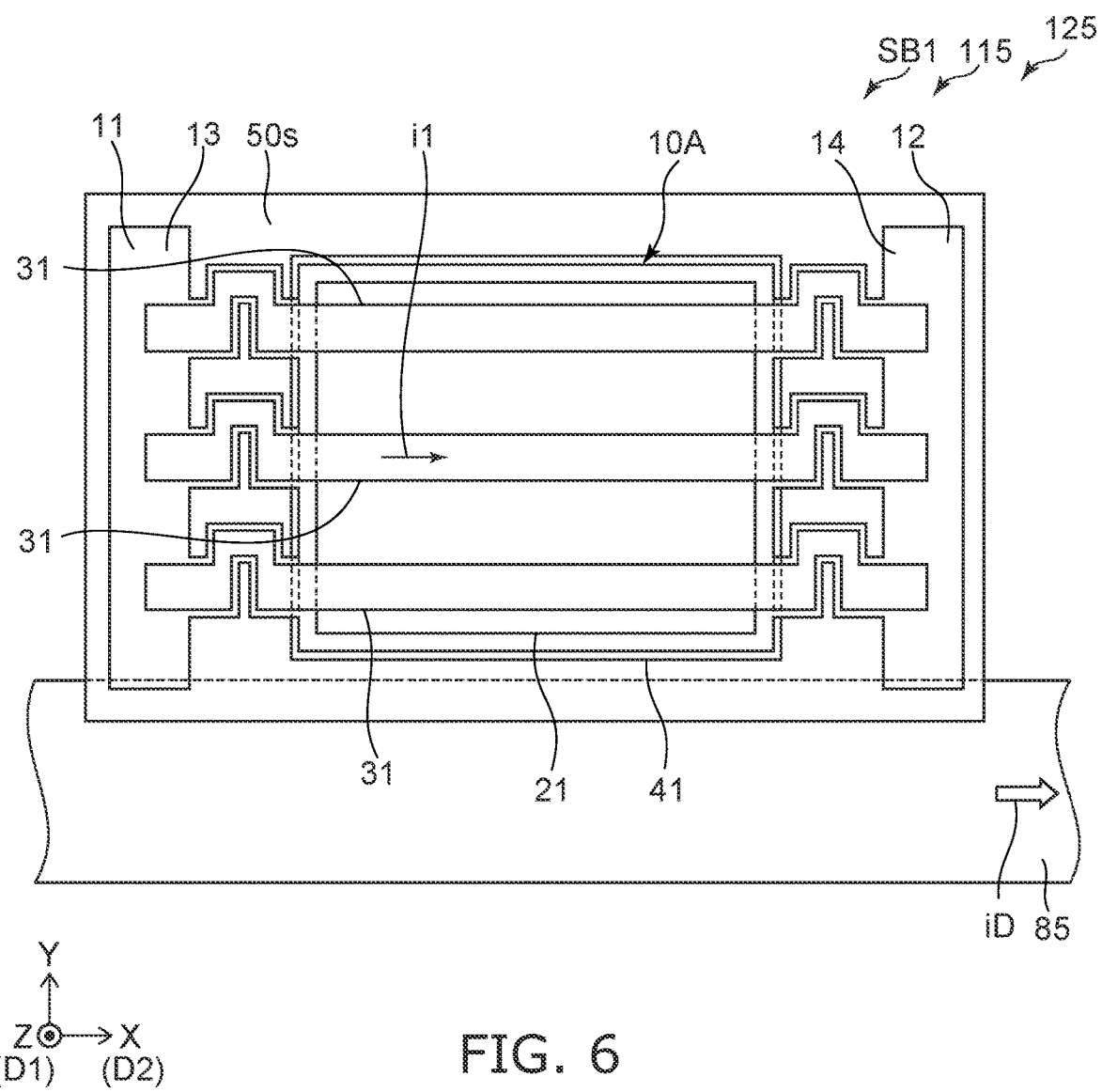
FIG. 6 is a schematic plan view illustrating a sensor according to the first embodiment.

As shown in FIG. 6, in a sensor 115 (and an electric device 125) according to the embodiment, the first movable portion 10A does not overlap the detection target wiring 85 in the Z-axis direction. Except for this, the configuration of the sensor 115 may be the same as that of the sensor 113. Even if the first movable portion 10A does not overlap the detection target wiring 85, the first distance d1 between the first fixed electrode 41 and the first movable portion 10A changes according to the detection target current iD. The first capacitance changes.

The sensors 113 to 115 can also detect the current with a simple configuration, A practical sensor can be provided.

Figure 7A:
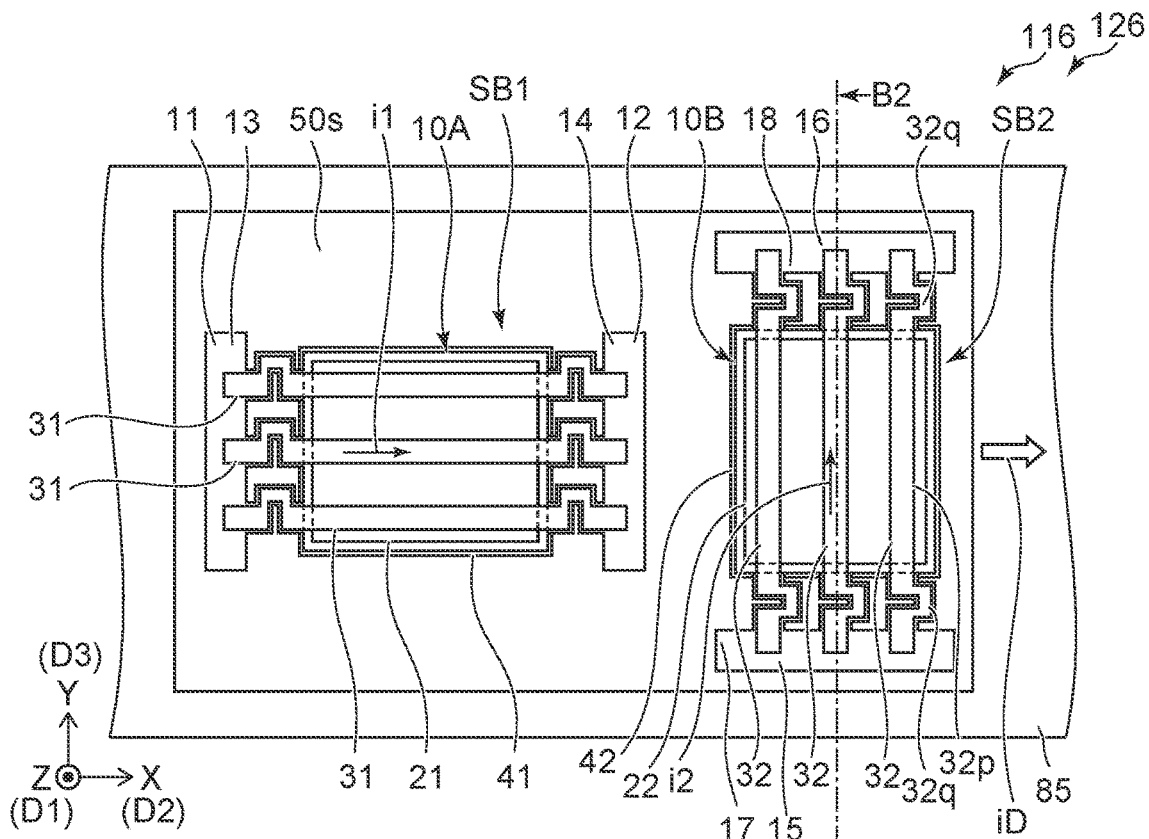
FIGS. 7A and 7B are schematic views illustrating a sensor according to the first embodiment.
Figure 7B:
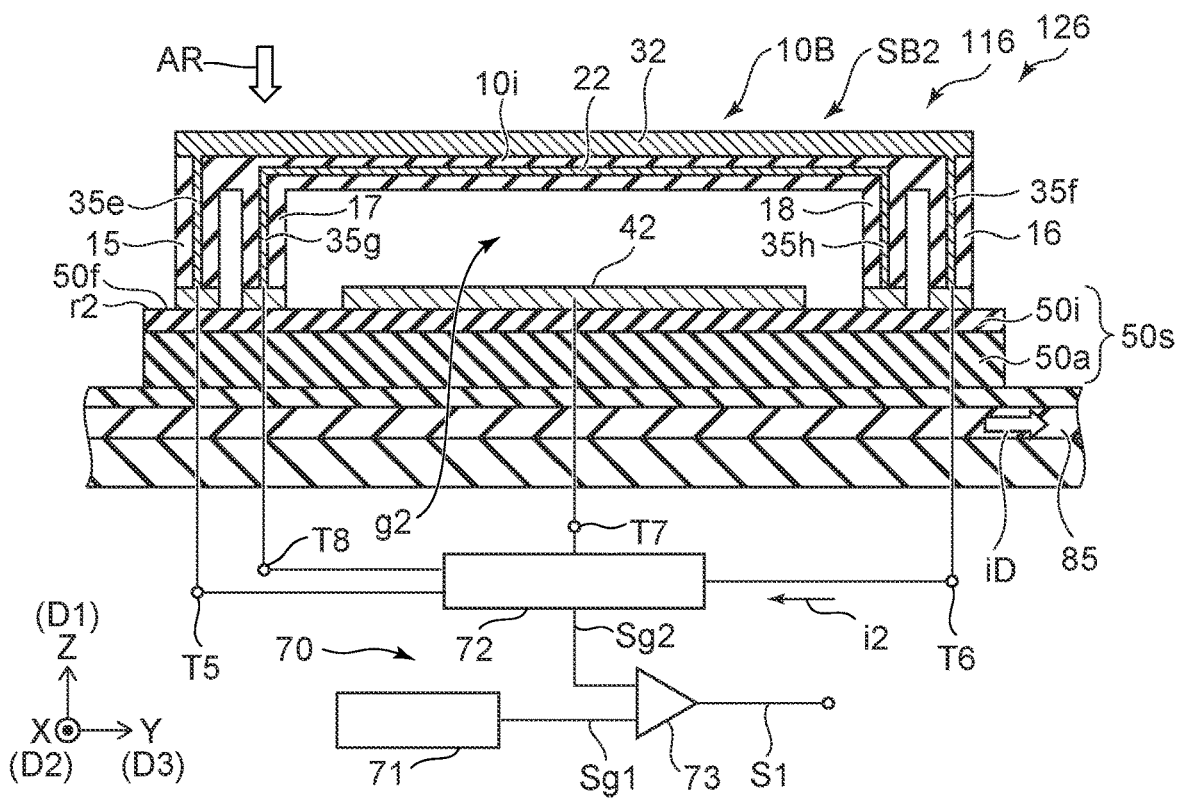

FIGS. 7A and 7B are schematic views illustrating a sensor according to the first embodiment, FIG. 7B is a sectional view taken along line B1-B2 of FIG. 7A. FIG. 7A is a transparent plan view seen along the arrow AR of FIG. 7B.

As shown in FIGS. 7A and 7B, a sensor 116 according to the embodiment includes the second structure body SB2. The electric device 126 includes the sensor 116 and the detection target wiring 85.

As shown in FIG. 7B, the second structure body SB2 is fixed to a second face region r2 of the first face 50f of the base 50s.

The second structure body SB2 includes a fifth support portion 15, a sixth support portion 16, a second movable portion 10B, and a second fixed electrode 42. The fifth support portion 15 and the sixth support portion 16 are fixed to the second face region r2. The second movable portion 10B is supported by the fifth support portion 15 and the sixth support portion 16. The second movable portion 10B is apart from the base 50s in the first direction D1. The second fixed electrode 42 is fixed to the second face region r2.

The second movable portion 10B includes a second movable electrode 22 and a second conductive member 32. The second movable electrode 22 faces the second fixed electrode 42, A second gap g2 is provided between the second fixed electrode 42 and the second movable portion 10B.

The second conductive member 32 is along, for example, the D3. The third direction D3 crosses the plane including the first direction D1 and the second direction D2. The third direction D3 is, for example, the Y-axis direction.

A second current i2 can flow through the second conductive member 32, The second current i2 is along a direction (for example, the third direction D3) that crosses the plane including the first direction D1 and the second direction D2.

For example, the magnetic field caused by the detection target current iD is along, for example the third direction D3, Therefore, when the second current i2 is supplied to the second conductive member 32, the second movable portion 10B is substantially not displaced. In the second structure body SB2, the second capacitance between the second fixed electrode 42 and the second movable electrode 22 does not substantially depend on the detection target current iD.

When the detection target current iD does not flow, the difference (for example, a ratio) between the first capacitance and the second capacitance is substantially constant. The temperature of the second structure body SB2 is substantially the same as the temperature of the first structure body SB1. By detecting the difference in the signals obtained from these structure bodies, the temperature characteristics are corrected.

For example, by detecting the difference between the first capacitance obtained from the first structure body SB1 and the second capacitance obtained from the second structure body SB2, the detection target current iD can be detected with high accuracy suppressing the influence of temperature.

For example, as shown in FIG. 7B, the second current i2 is supplied to the second conductive member 32 by a second circuit 72 of the controller 70. The second capacitance is detected by the second circuit 72.

For example, a first signal Sg1 corresponding to the first capacitance obtained from the first circuit 71 and a second signal Sg2 corresponding to the second capacitance obtained from the second circuit 72 are supplied to the third circuit 73. A third circuit 73 includes, for example, a differential amplifier. From the third circuit 73, a signal S1 corresponding to the difference between the first signal Sg1 and the second signal Sg2 is obtained.

As shown in FIG. 73, the second structure body SB2 may include a seventh support portion 17 and an eighth support portion 18, The seventh support portion 17 supports at least a part of the second movable portion 103. The eighth support portion 18 supports at least a part of the second movable portion 10B. The seventh support portion 17 may be continuous with the fifth support portion 15. The boundary between the seventh support portion 17 and the 5th support portion 15 may be clear or unclear. The seventh support portion 17 may be omitted. The eighth support portion 18 may be continuous with the sixth support portion 16. The boundary between the eighth support portion 18 and the sixth support portion 16 may be clear or unclear. The eighth support portion 18 may be omitted.

The second structure body SB2 may include fifth to eighth terminals T5 to T8, The fifth terminal T5 is electrically connected with one end of the second conductive member 32. The sixth terminal T6 is electrically connected with the other end of the second conductive member 32. The seventh terminal T7 is electrically connected with the second fixed electrode 42. The eighth terminal T8 is electrically connected with the second movable electrode 22.

The controller 70 (for example, the second circuit 72) can supply the second current i2 to the second conductive member 32 via, for example, the fifth terminal T5 and the sixth terminal T6, The controller 70 (for example, the second circuit 72) has can detect the second capacitance (and the change of the second capacitance) between the second fixed electrode 42 and the second movable electrode 22 vi a seventh terminal T7 and the eighth terminal T8.

As shown in FIG. 73, the second structure body SB2 may include a fifth connecting conductive portion 35e and a sixth connecting conductive portion 35f. The fifth connecting conductive portion 35e is electrically connected with one end of the second conductive member 32. The sixth connecting conductive portion 35f is electrically connected with the other end of the second conductive member 32. For example, at least a part of the fifth connecting conductive portion 35e passes through the fifth support portion 15. At least a part of the sixth connecting conductive portion 35f passes through the sixth support portion 16. For example, the fifth connection conductive portion 35e is electrically connected with the fifth terminal T5. For example, the sixth connection conductive portion 35f is electrically connected with the sixth terminal T6.

As shown in FIG. 7B, the second structure SB2 may include a seventh connecting conductive portion 35g and an eighth connecting conductive portion 35h. The seventh connection conductive portion 35g is electrically connected with a part of the second movable electrode 22, The eighth connection conductive portion 35h is electrically connected with the other portion of the second movable electrode 22. At least one of the seventh connecting conductive portion 35g and the eighth connecting conductive portion 35h is electrically connected with the eighth terminal T8.

For example, the fifth connecting conductive portion 35e may pass through the fifth support portion 15. For example, the sixth connecting conductive portion 35f may pass through the sixth support portion 16. For example, the 7th connection conductive portion 35g may pass through the 7th support portion 17. For example, the eighth connection conductive portion 35h may pass through the eighth support portion 18.

Figure 8:
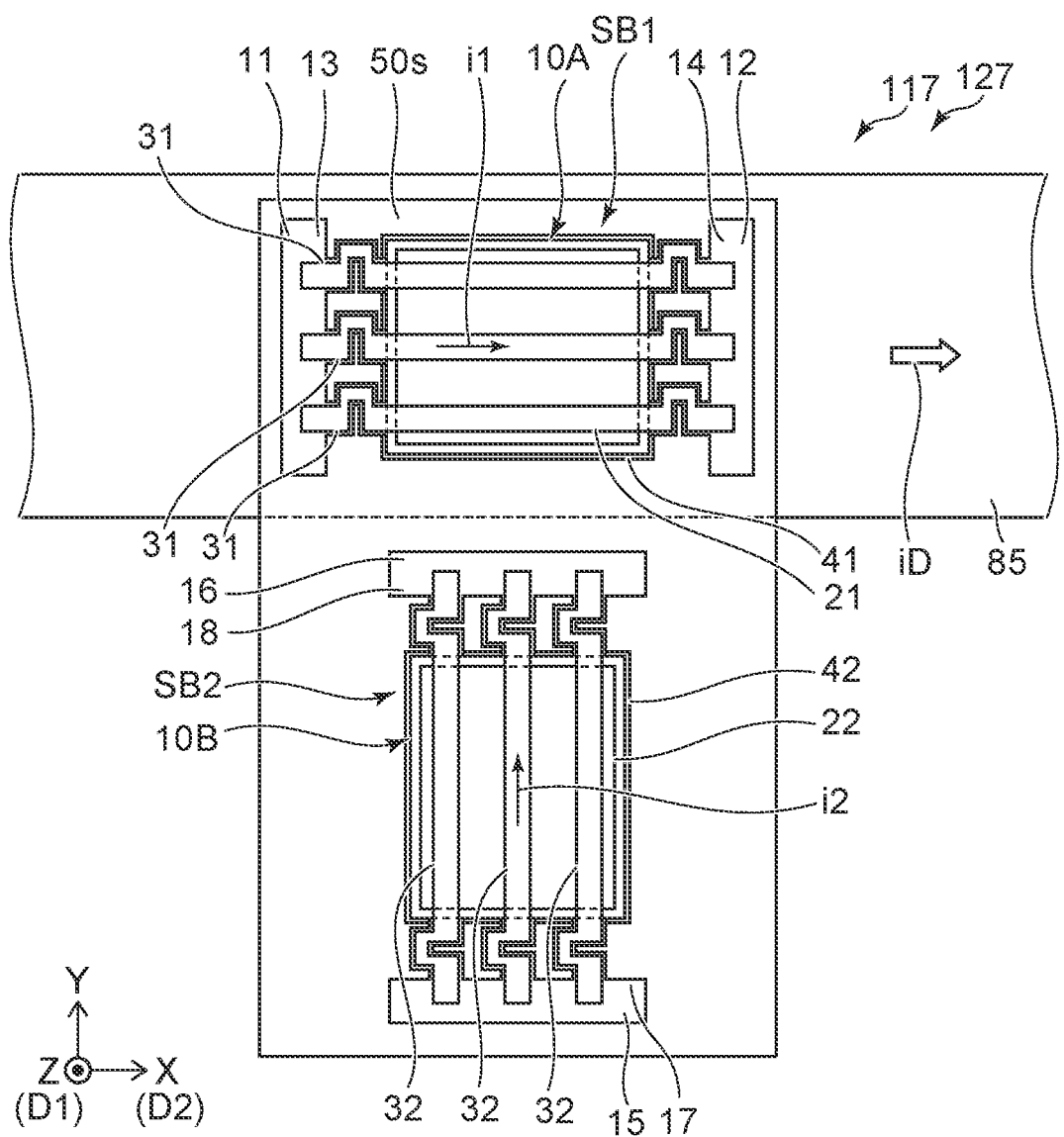
FIG. 8 is a schematic plan view illustrating a sensor according to the first embodiment.

In the sensor 116, the first movable portion 10A and the second movable portion 10B overlap the detection target wiring 85 in the Z-axis direction, FIG. 8 is a schematic plan view illustrating a sensor according to the first embodiment.

As shown in FIG. 8, in the sensor 117 (and the electric device 127, the first movable portion 10A overlaps detection target wiring 85 in the Z-axis direction. The second movable portion 10B does not overlap the detection target wiring 85 in the Z-axis direction. The sensor 117 can also detect the detection target current iD with high accuracy while suppressing the influence of temperature.

Second Embodiment

Figure 9:
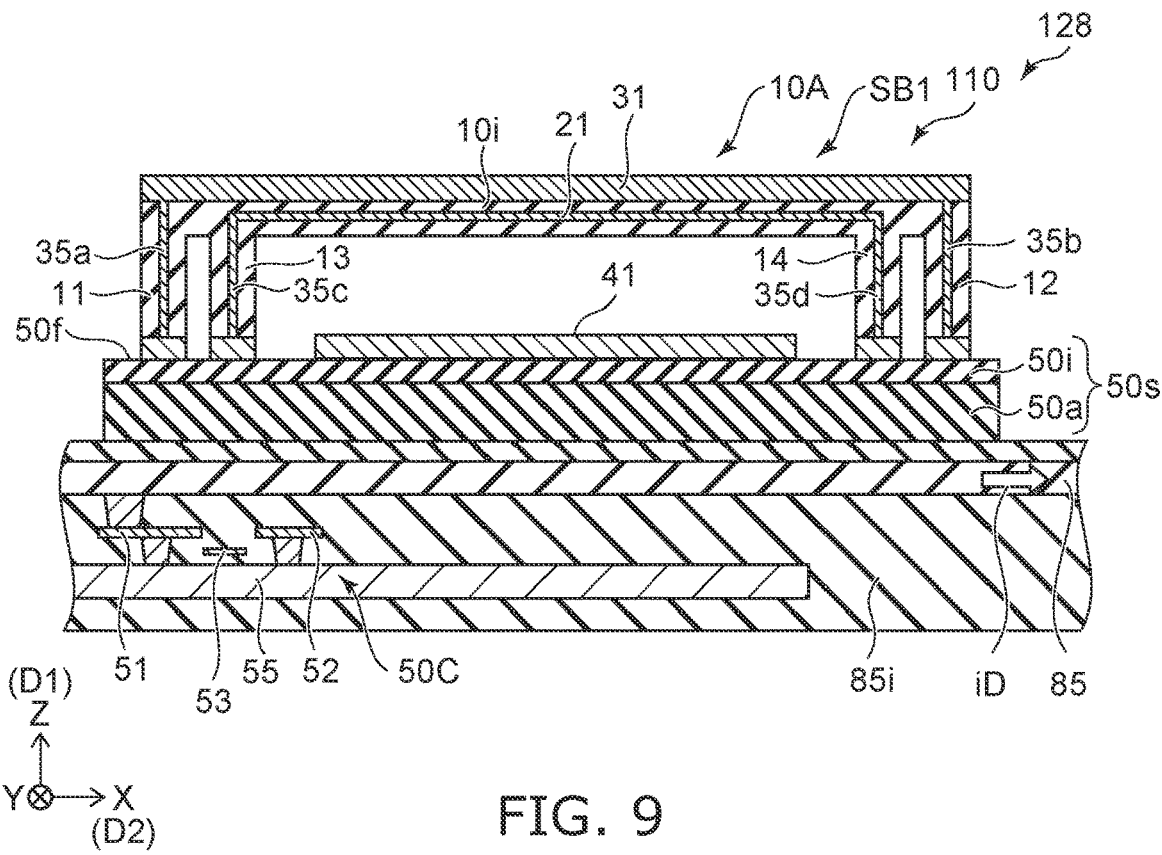
FIG. 9 is a schematic cross-sectional view illustrating an electric device according to the second embodiment.

FIG. 9 is a schematic cross-sectional view illustrating an electric device according to a second embodiment.

As shown in FIG. 9, an electric device 128 according to the embodiment includes an arbitrary sensor (in this example, the sensor 110) according to the first embodiment and an electric circuit 50C. The detection target current iD can low in the electric circuit 50C. As described above, the detection target current iD flows along the second direction D2. For example, the electric circuit 50C includes the detection target wiring 85 through which the detection target current iD can flow. The first fixed electrode 41 is located between the detection target wiring 85 and the first movable portion 10A.

As shown in FIG. 9, for example, the electric circuit 50C includes a first conductive layer 51 and the detection target wiring 85 electrically connected with the first conductive layer 51. In this example, the electric circuit 50C includes a second conductive layer 52, a third conductive layer 53, and a semiconductor member 55. The first conductive layer 51 is, for example, a source electrode. The second conductive layer 52 is, for example, a drain electrode. The third conductive layer 53 is, for example, a gate electrode. The first conductive layer 51, the second conductive layer 52, the third conductive layer 53, and the semiconductor member 55 may be provided in, for example, an insulating base member 50a. A part of the base member 50a may be provided between the semiconductor member 55 and the third conductive layer 53, An insulating member 85i may be provided around the detection target wiring 85.

For example, the electric circuit 50C is a transistor. In the embodiment, the electric circuit 50C may be a two-terminal element. The electric circuit 50C may include, for example, a circuit for power control (for example, a semiconductor device), The electric circuit 50C may include, for example, a diode or a power transistor. The power transistor may include, for example, a power MOSET or an insulated gate bipolar transistor (IGBT), The electric circuit 50C may include, for example, a thyristor, a gate turn-off thyristor (GTO), a triac, or the like.

Third Embodiment

Figure 10:
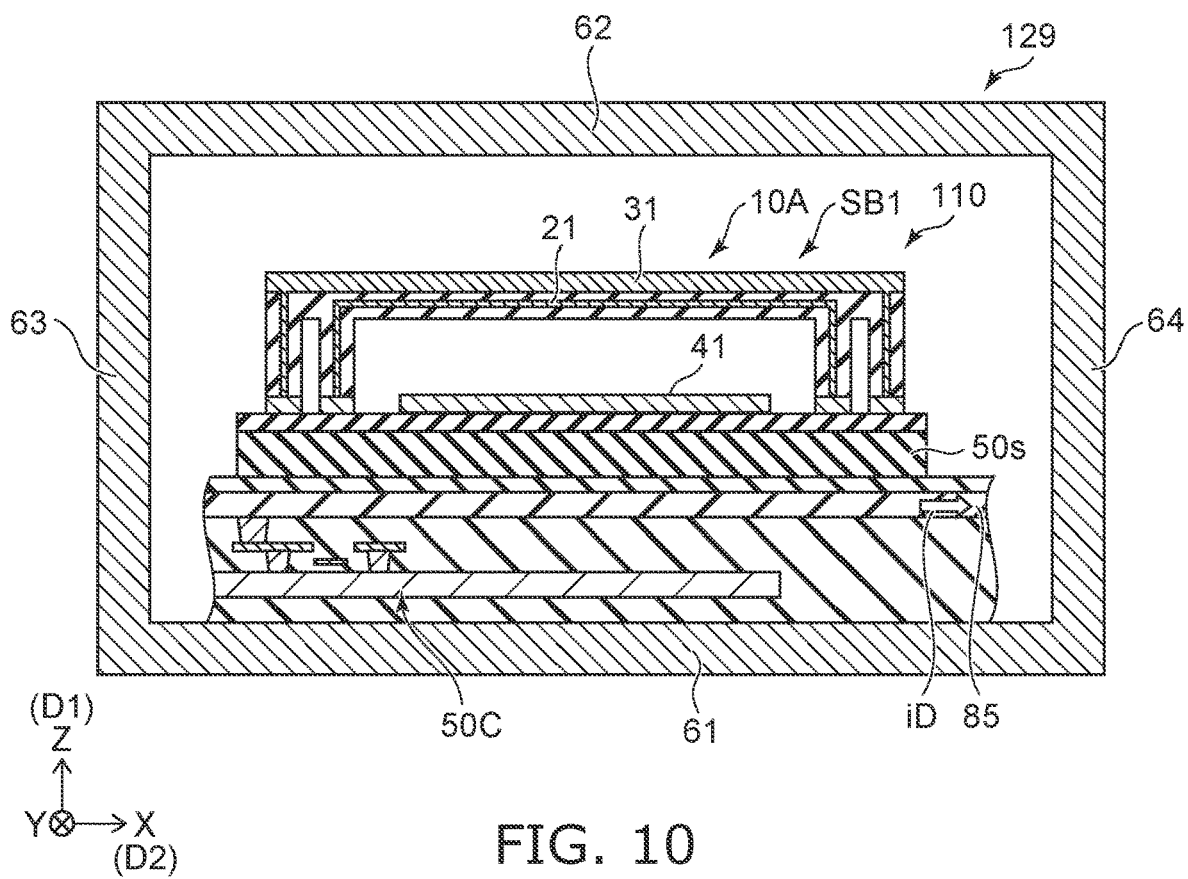
FIG. 10 is a schematic cross-sectional view illustrating an electric device according to the third embodiment.

FIG. 10 is a schematic cross-sectional view illustrating an electric device according to a third embodiment.

As shown in FIG. 10, an electric device 129 according to the embodiment includes a sensor (for example, sensor 110) according to the first embodiment, an electric circuit 50C, and first to fourth members 61-64. The base 50s and the first structure body SB1 are provided between the first member 61 and the second member 62. At least one of the first member 61 or the second member 62 functions as a magnetic shield. At least one of the first member 61 or the second member 62 attenuates an external magnetic field. By providing a magnetic shield, more stable and highly accurate detection becomes possible.

In this example, a direction from the first member 61 to the second member 62 is along the first direction (Z-axis direction).

The base 50s and the first structure body SB1 are provided between the third member 63 and the fourth member 64. At least one of the third member 63 or the fourth member 64 functions as a magnetic shield. At least one of the third member 63 or the fourth member 64 attenuates an external magnetic field. By providing a magnetic shield, more stable and highly accurate detection becomes possible. In this example, a direction from the first member 61 to the second member 62 is along the XY plane.

The embodiments may include, for example, following configurations (for example, technical proposals).

Configuration 1

A sensor, comprising:
a base including a first face including a first face region; and
a first structure body fixed to the first face region,
the first structure body including:
a first support portion fixed to the first face region, and
a second support portion fixed to the first face region,
a first movable portion supported by the first support portion and the second support portion and apart from the base in a first direction crossing the first face region,
a first fixed electrode fixed to the first face region,
the first movable portion including:
a first movable electrode facing the first fixed electrode, and
a first conductive member, a first current being configured to flow the first conductive member along a second direction crossing the first direction,
a first gap being provided between the first fixed electrode and the first movable portion, Configuration 2

The sensor according to Configuration 1, wherein the first movable electrode is between the first fixed electrode and the first conductive member in the first direction.

Configuration 3

The sensor according to Configurations 1 or 2, wherein a direction from the first support portion to the second support portion is along the second direction.

Configuration 4

The sensor according to one of Configurations 1-3, wherein
the first structure body further includes;
a first connecting conductive portion electrically connected with one end of the first conductive member, and
a second connecting conductive portion electrically connected with an other end of the first conductive member,
at least a part of the first connection conductive portion passes through the first support portion, and
at least a part of the second connecting conductive portion passes through the second support portion.

Configuration 5

The sensor according to one of Configurations 1-3, wherein,
the first structure body further includes;
a first flexible portion provided between the first support portion and the first movable electrode, and
a second flexible portion provided between the second support portion and the first movable electrode,
a width of the first flexible portion is smaller than a width of the first movable electrode, and
a width of the second flexible portion is smaller than a width of the first movable electrode.

Configuration 6

The sensor according to Configuration 5, wherein,
the first structure body includes;
a first connecting conductive portion electrically connected with one end of the first conductive member, and
a second connecting conductive portion electrically connected with an other end of the first conductive member,
at least a part of the first connecting conductive portion passes through the first flexible portion, and
at least a part of the second connecting conductive portion passes through the second flexible portion.

Configuration 7

The sensor according to one of Configurations 4-6, wherein, a direction from the one end of the first conductive member to the other end of the first conductive member is along the second direction.

Configuration 8

The sensor according to one of Configurations 1-7, wherein,
the first structure body includes;
a third support portion supporting at least a part of the first movable portion,
a third connecting conductive portion electrically connected with a part of the first movable electrode.

Configuration 9

The sensor according to Configuration 8, wherein,
the first structure body further includes;
a fourth support portion supporting at least a part of the first movable portion, and
a fourth connecting conductive portion electrically connected with the other part of the first movable electrode.

Configuration 10

The sensor according to Configuration 9, wherein, a direction from the third support portion to the fourth support portion crosses a plane including the first direction and the second direction.

Configuration 11

The sensor according to one of Configurations 1-10, wherein the first movable portion includes a plurality of the first conductive members.

Configuration 12

The sensor according to one of Configurations 1-11, wherein a first distance between the first fixed electrode and the first movable portion changes according to a detection target current along the second direction, when the first current flows through the first conductive member.

Configuration 13

The sensor according to one of Configurations 1-11, wherein a capacitance between the first fixed electrode and the first movable electrode changes according to a detection target current along the second direction, when the first current flows through the first conductive member.

Configuration 14

The sensor according to Configurations 12 or 13, wherein the first fixed electrode is located between the detection target wiring and the first movable portion, and the detection target current flows through the detection target wiring, Configuration 15

The sensor according to one of Configurations 1-14, further comprising a controller configured to supply the first current to the first conductive member.

Configuration 16

The sensor according to Configuration 15, wherein the controller is configured to detect a change in a first capacitance between the first fixed electrode and the first movable electrode, Configuration 17

The sensor according to one of Configurations 1-16, further comprising a second structure body fixed to a second face region of the first face, the second structure body including:
a fifth support portion fixed to the second face region, and
a sixth support portion fixed to the second face region,
a second movable portion supported by the fifth support portion and the sixth support portion and apart from the base in the first direction,
a second fixed electrode fixed to the second face region,
the second movable portion including:
a second movable electrode facing the second fixed electrode, and
a second conductive member,
a second gap being provided between the second fixed electrode and the second movable portion.

Configuration 18

The sensor according to Configuration 17, wherein a second current is configured to flow through the second conductive member along a direction crossing a plane including the first direction and the second direction, Configuration 19

An electric device, comprising
the sensor according to one of Configurations 1-11; and
an electric circuit,
a detection target current being configured to flow through the electric circuit,
the detection target current being configured to flow along the second direction.

Configuration 20

The device according to Configuration 19, wherein
the electric circuit includes a detection target wiring through which the detection target current can flow, and
the first fixed electrode is located between the detection target wiring and the first movable portion.

According to embodiments, practical sensors and electric devices can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as bases, support portions, movable portions, fixed electrodes, controller, etc., from known art, Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors and electric devices practicable by an appropriate design modification by one skilled in the art based on the sensors and the electric devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising: a base including a first face including a first face region; and a first structure body fixed to the first face region, the first structure body including: a first support portion fixed to the first face region, and a second support portion fixed to the first face region, a first movable portion supported by the first support portion and the second support portion and apart from the base in a first direction crossing the first face region, a first fixed electrode fixed to the first face region, the first movable portion including: a first movable electrode facing the first fixed electrode, and a first conductive member, a first current being configured to flow through the first conductive member along a second direction crossing the first direction, a first gap being provided between the first fixed electrode and the first movable portion.

2. The sensor according to claim 1, wherein the first movable electrode is between the first fixed electrode and the first conductive member in the first direction.

3. The sensor according to claim 1, wherein a direction from the first support portion to the second support portion is along the second direction.

4. The sensor according to claim 1, wherein
the first structure body further includes;
a first connecting conductive portion electrically connected with one end of the first conductive member, and a second connecting conductive portion electrically connected with an other end of the first conductive member, at least a part of the first connection conductive portion passes through the first support portion, and at least a part of the second connecting conductive portion passes through the second support portion.

5. The sensor according to claim 1, wherein, the first structure body further includes;

a first flexible portion provided between the first support portion and the first movable electrode, and a second flexible portion provided between the second support portion and the first movable electrode, a width of the first flexible portion is smaller than a width of the first movable electrode, and a width of the second flexible portion is smaller than a width of the first movable electrode.

6. The sensor according to claim 5, wherein, the first structure body includes;

a first connecting conductive portion electrically connected with one end of the first conductive member, and a second connecting conductive portion electrically connected with an other end of the first conductive member, at least a part of the first connecting conductive portion passes through the first flexible portion, and at least a part of the second connecting conductive portion passes through the second flexible portion.

7. The sensor according to claim 4, wherein, a direction from the one end of the first conductive member to the other end of the first conductive member is along the second direction.

8. The sensor according to claim 1, wherein, the first structure body includes;

a third support portion supporting at least a part of the first movable portion, a third connecting conductive portion electrically connected with a part of the first movable electrode.

9. The sensor according to claim 8, wherein, the first structure body further includes;

a fourth support portion supporting at least a part of the first movable portion, and a fourth connecting conductive portion electrically connected with the other part of the first movable electrode.

10. The sensor according to claim 9, wherein, a direction from the third support portion to the fourth support portion crosses a plane including the first direction and the second direction.

11. The sensor according to claim 1, wherein the first movable portion includes a plurality of the first conductive members.

12. The sensor according to claim 1, wherein a first distance between the first fixed electrode and the first movable portion changes according to a detection target current along the second direction, when the first current flows through the first conductive member.

13. The sensor according to claim 1, wherein a capacitance between the first fixed electrode and the first movable electrode changes according to a detection target current along the second direction, when the first current flows through the first conductive member.

14. The sensor according to claim 12, wherein the first fixed electrode is located between the detection target wiring and the first movable portion, and the detection target current flows through the detection target wiring.

15. The sensor according to claim 1, further comprising a controller configured to supply the first current to the first conductive member.

16. The sensor according to claim 15, wherein the controller is configured to detect a change in a first capacitance between the first fixed electrode and the first movable electrode.

17. The sensor according to claim 1, further comprising a second structure body fixed to a second face region of the first face, the second structure body including:

a fifth support portion fixed to the second face region, and a sixth support portion fixed to the second face region, a second movable portion supported by the fifth support portion and the sixth support portion and apart from the base in the first direction, a second fixed electrode fixed to the second face region, the second movable portion including:

a second movable electrode facing the second fixed electrode, and a second conductive member, a second gap being provided between the second fixed electrode and the second movable portion.

18. The sensor according to claim 17, wherein a second current is configured to flow through the second conductive member along a direction crossing a plane including the first direction and the second direction.

19. An electric device, comprising the sensor according to claim 1; and an electric circuit, a detection target current being configured to flow through the electric circuit, the detection target current being configured to flow along the second direction.

* * * * *